United States Patent [19]
White

[11] Patent Number: 5,942,317
[45] Date of Patent: Aug. 24, 1999

[54] HYDROGENATED CARBON THIN FILMS

[75] Inventor: Richard Longstreth White, Los Altos, Calif.

[73] Assignee: International Business Machines Corporation, Armonk, N.Y.

[21] Appl. No.: 08/792,592

[22] Filed: Jan. 31, 1997

[51] Int. Cl.[6] ..................................................... B32B 9/00
[52] U.S. Cl. ........................ 428/216; 428/212; 428/336; 428/408
[58] Field of Search ................... 428/408, 212, 428/336, 216

[56] References Cited

U.S. PATENT DOCUMENTS

| | | | |
|---|---|---|---|
| Re. 32,464 | 7/1987 | Aine | 428/622 |
| 4,597,844 | 7/1986 | Hiraki et al. | 428/408 |
| 4,755,426 | 7/1988 | Kokai et al. | 428/336 |
| 4,778,582 | 10/1988 | Howard | 204/192.15 |
| 4,804,590 | 2/1989 | Nakamura et al. | 428/408 |
| 4,820,584 | 4/1989 | Morita et al. | 428/336 |
| 4,877,677 | 10/1989 | Hirochi et al. | 428/216 |
| 4,880,687 | 11/1989 | Yokoyama et al. | 428/408 |
| 5,045,165 | 9/1991 | Yamashita | 204/192.16 |
| 5,266,409 | 11/1993 | Schmidt et al. | 428/408 |
| 5,356,522 | 10/1994 | Lal et al. | 204/192.15 |
| 5,364,690 | 11/1994 | Takahashi et al. | 428/408 |
| 5,368,937 | 11/1994 | Itoh | 428/408 |
| 5,397,644 | 3/1995 | Yamashita | 428/408 |
| 5,494,742 | 2/1996 | Seki et al. | 428/332 |
| 5,607,783 | 3/1997 | Onodera | 428/408 |
| 5,631,087 | 5/1997 | Fukuda et al. | 428/408 |
| 5,679,431 | 10/1997 | Chen et al. | 428/408 |

OTHER PUBLICATIONS

"The Effect of Hydrogen In Carbon Overcoats On The Tribology Of The Head—Disk Interface" IEE Trans. On Magn. vol. 31, No. 6 Nov. 1995.

"Dual—Carbon" A New Surface Protective Film For Thin Film Hard Disks IEEE Trans. On Magn. vol. MAG–22 No. 5, Sep. 1986.

*Primary Examiner*—Archene Turner
*Attorney, Agent, or Firm*—G. Marlin Knight

[57] ABSTRACT

The embodiments of the invention are one, two or three layer protective hydrogenated carbon (C:H) thin film coatings on a disk with hydrogenation levels that are higher at the surface and decrease from the surface downward toward the substrate. The hydrogen content of the various layers or zones of the overcoat are optimized to use the varying properties of C:H films such as good adhesion obtained with a low level of hydrogen, the high hardness of an intermediate level of hydrogen content and the low surface energy of a high hydrogen content film. In one embodiment the disk is coated with a sputtered C:H thin film with a gradient in the hydrogen concentration, with the concentration increasing toward the film surface. A second embodiment of the invention uses two layers in which the hydrogen content of bottom layer is lower than the surface layer. A third embodiment of the invention uses a three layer construction of the thin-film having a minimum hydrogenation level in the bottom layer, an intermediate hydrogenation level in the middle layer and a high hydrogenation level in the top layer.

15 Claims, 6 Drawing Sheets

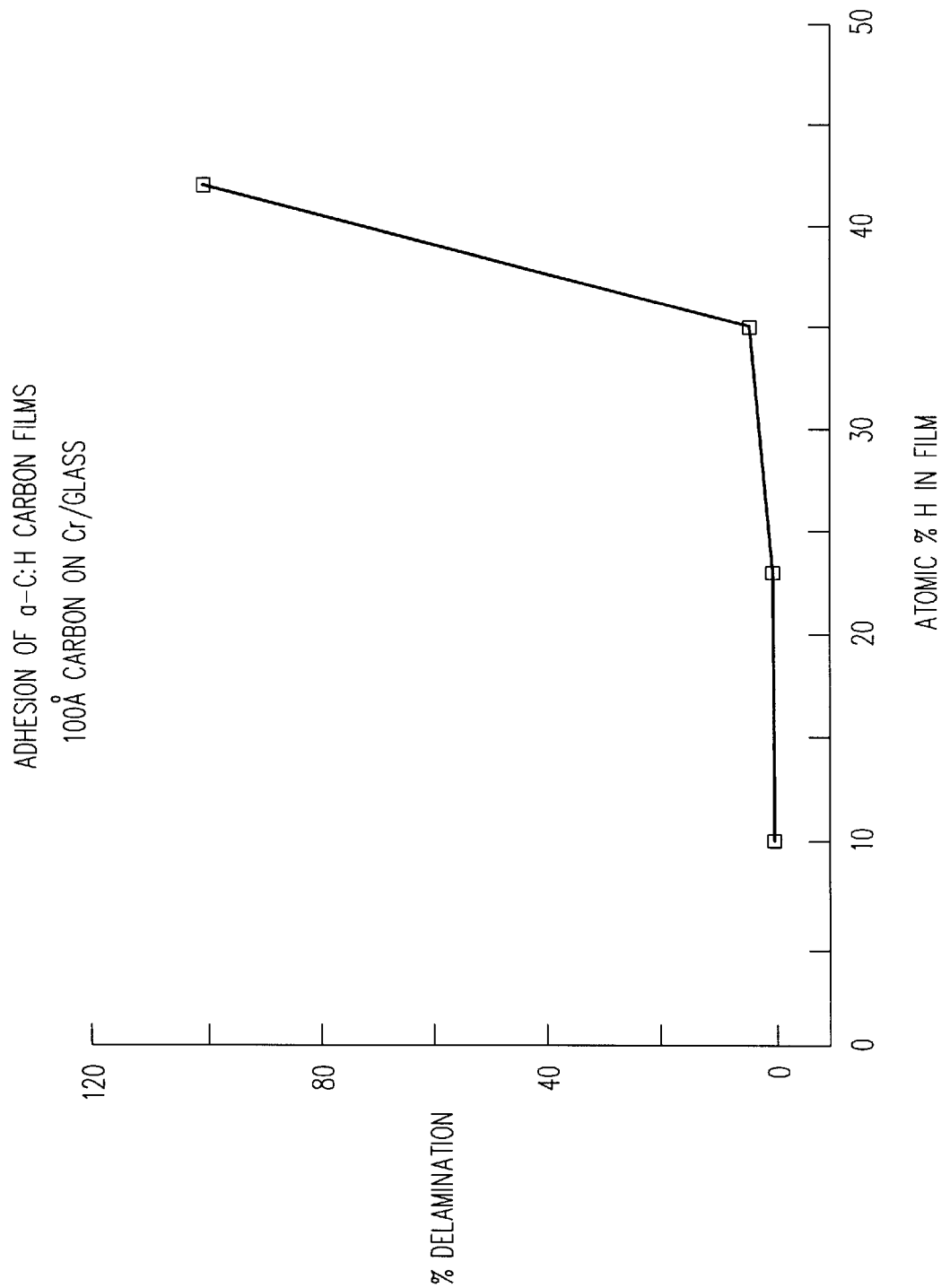

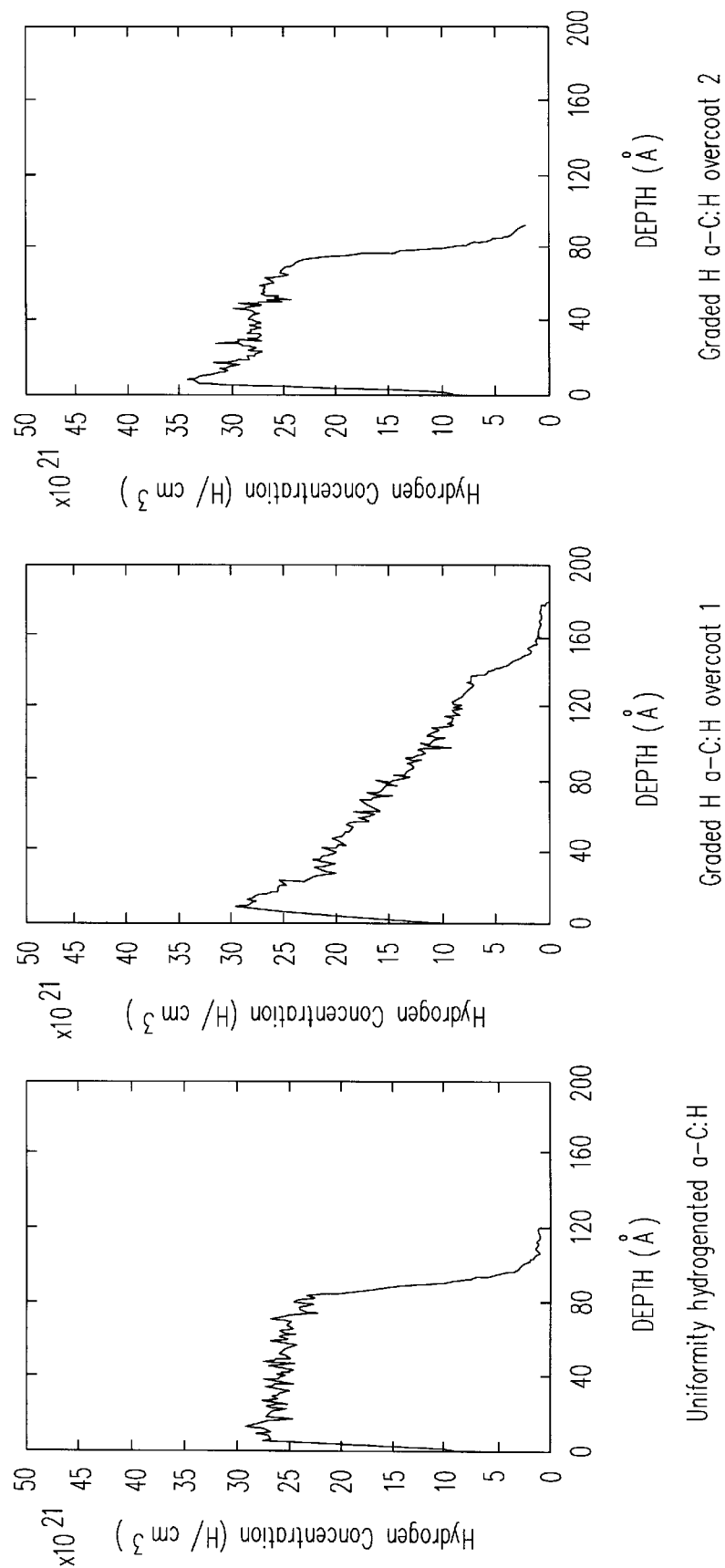

HYDROGENATED CARBON THIN FILMS

FIELD OF THE INVENTION

The present invention relates to the field of disk drives. More particularly, the invention pertains to a thin film magnetic disk for use in a disk drive, wherein the disk or slider has at least one hydrogenated carbon layer.

BACKGROUND OF THE INVENTION

A disk drive or direct access storage device ("DASD") includes one or more thin film magnetic disks stacked on a spindle. A plurality of thin film layers are deposited onto a rigid substrate typically including an underlayer, a magnetic layer and a protective overcoat. Data is stored on these disks by magnetizing portions of the disk in a pattern which reflects the data.

The read and write heads are contained in a small ceramic element called a slider. When operating at full speed the slider typically is flown at a height of approximately one to two millionths of an inch from the surface of the disk as data is written or read from the disk. During startup and shutdown processes when the disk is either not rotating or is rotating too slowly to provide the air bearing, the slider may be in contact with the disk. Shock events can also cause the slider to contact the disk. There are also proposals to operate drives with the slider essentially in contact with the disk surface.

The slider and the disk, therefore, require a wear-resistant coating. Various materials have been explored for use as disk overcoats including carbon, silicon dioxide and various other oxides. Hydrogenation of the sputtered carbon film is known to improve the durability of the thin-films, as discussed in U.S. Pat. No. 5,045,165 to Yamashita. Yamashita found that the addition of 20% hydrogen into the sputtering chamber resulted in significant hydrogen being incorporated into the film with the carbon. Kokai, et al., in U.S. Pat. No. 4,755,426 teach use a carbonaceous overcoat consisting essentially of carbon, hydrogen and oxygen.

Ishikawa, et al., (IEEE Trans. Mag-22, No. 5, September 1986) disclose the use a two layer overcoat with the first layer being either sputtered carbon or PCVD carbon followed by a second PCVD carbon layer deposited using higher pressure acetylene. The PCVD carbon was obtained by DC or RF discharge chamber in an acetylene atmosphere. The upper layer was deposited using a high pressure of acetylene to result in a soft film. When PCVD carbon was used as the first layer it was deposited using a lower pressure of acetylene. Similarly, Nakamura, et al., (co-authors of the IEEE article) in U.S. Pat. No. 4,804,590 teach the use of two layers of carbonaceous material obtained by DC or RF discharge chamber in an acetylene atmosphere with the lower layer being comparatively hard and the upper layer being softer. The softer more lubricative layer is a PCVD carbonaceous film contain 6 at. % or more of either or both hydrogen and fluorine while the harder layer contains 5 at. % or less of hydrogen and fluorine. To provide better adhesion the use of an intermediate layer of chromium or titanium over the magnetic layer was suggested.

Itoh in U.S. Pat. No. 5,368,937 in connection with integrated circuits and thermal heads describes the use of increasing bias voltage during the plasma CVD process to generate an amorphous hydrogenated carbon layer in which the hardness increases toward the surface of the film. One of method of increasing the bias voltage is said to be to decrease the pressure of the reactive gas in the chamber.

Seki, et al., describe a carbon film which has a decreasing dopant concentration in the direction away from the surface. The presence of hydrogen reduces the adhesion of the thin-film to the underlying magnetic layer. Moreover, hardness and density are reduced by the presence of hydrogen in certain percentage ranges.

SUMMARY OF THE INVENTION

The invention in one embodiment is a protective thin-film coating on a disk with hydrogenation levels that increase through the thickness of the coating. In one embodiment the disk is coated with a sputtered hydrogenated carbon (C:H) thin film with a gradient in the hydrogen concentration, with the concentration increasing toward the film surface. A second embodiment of the invention uses a two layer thin film in which the hydrogen content of lower layer is regulated to get 0 to 35 at. % hydrogen to obtain comparative hardness with desirable adhesion properties and the hydrogen content of the upper layer is regulated for hydrogen content greater than 35 at. % to form a layer with reduced surface energy as indicated by high contact angles. A third embodiment of the invention uses a three layer construction of the thin-film. In this embodiment, a minimum hydrogenation level is used in the bottom layer that is in contact with the magnetic material for best adhesion; an intermediate hydrogenation level is used in the middle layer for hardness; and a high hydrogenation level is used in the top layer for low surface energy. Each embodiment of the invention provides increased durability and wear protection of the disk as compared to a sputtered hydrogenated carbon thin-film with a uniform level of hydrogenation or a bi-layer in which the hydrogen levels are not optimized. The overcoat of the invention is designed to tolerate the stress of direct contact with the slider by having good adhesion and good wear-resistance.

BRIEF DESCRIPTION OF THE DRAWINGS

FIG. 3 is a graph of scratch adhesion testing performed on the three layer coating of the present invention.

FIGS. 6A–C are a series of graphs showing hydrogen gradients in sample hydrogenated carbon thin-films.

DETAILED DESCRIPTION OF THE INVENTION

Figure 1:
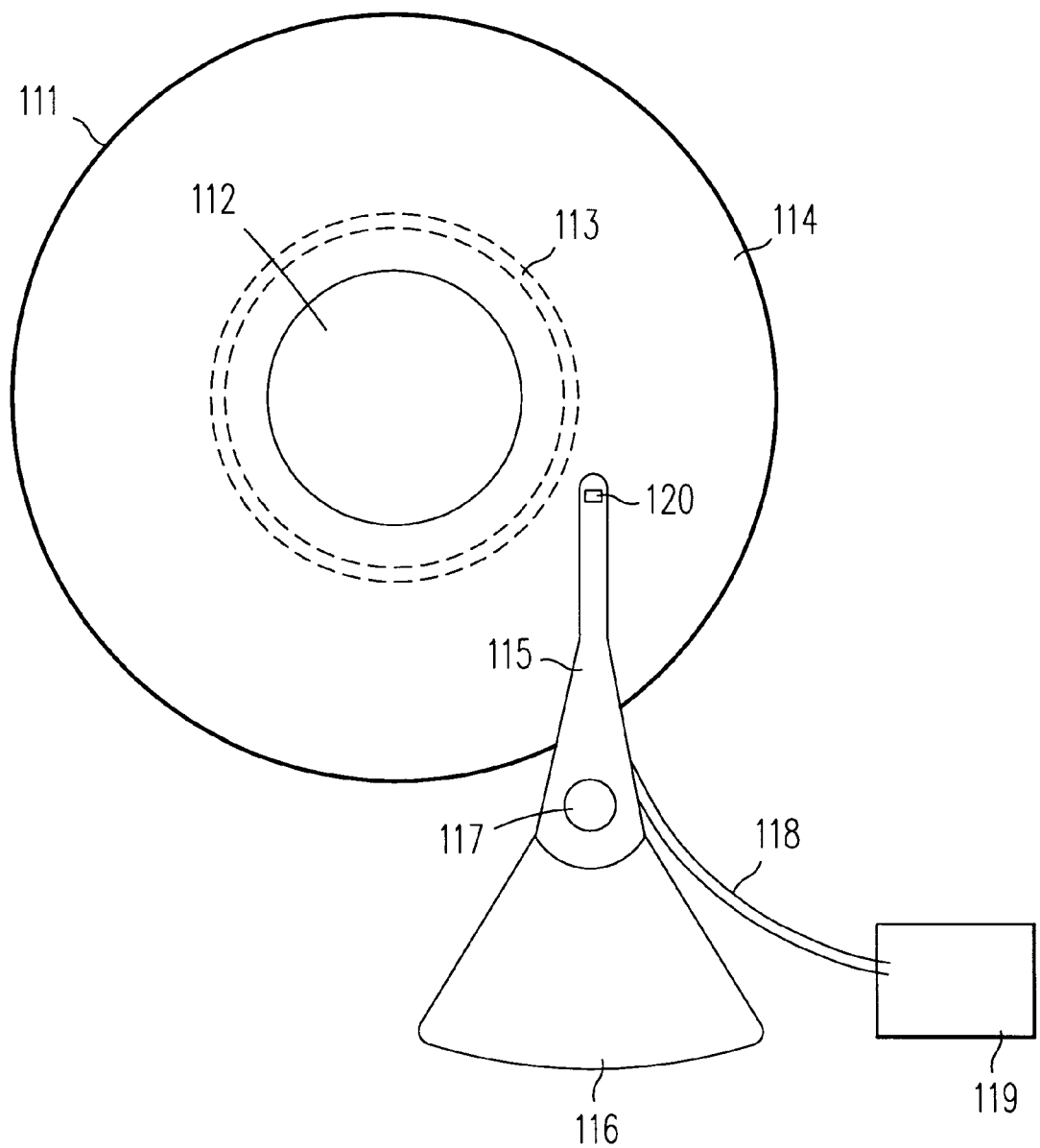
FIG. 1 is a top view diagram of a disk drive.

The invention relates to a magnetic disk for use in a disk drive and methods for manufacturing the disk. The invention can be better understood by reference to the drawings. FIG. 1 is a top view of a disk drive of the type in which the invention may be usefully employed. It includes a rotary actuator 115, and an associated magnetic storage disk 114 mounted on a spindle 112, which is rotated by a drive motor (not shown) mounted in a housing (not shown). The rotary actuator moves the slider 120 in an arcuate path across the disk. The rotary actuator includes a voice coil motor (VCM) 116. The electrical signals from the actuator pass through a ribbon cable 118 to the control electronics 119.

The slider may be continuously in contact with the disk or may only contact the during starting, stopping or crash events. Typically when the disk rotation is started, the slider remains in contact with the disk until sufficient linear speed is attained to support an air-bearing under the slider. When the disk is turned off, the slider again comes in contact with the disk as the relative speed of the disk slows below the "take-off" velocity. Wear of the thin-film that forms the disk overcoat occurs primarily during these start and stop cycles of the disk.

Figure 2A:
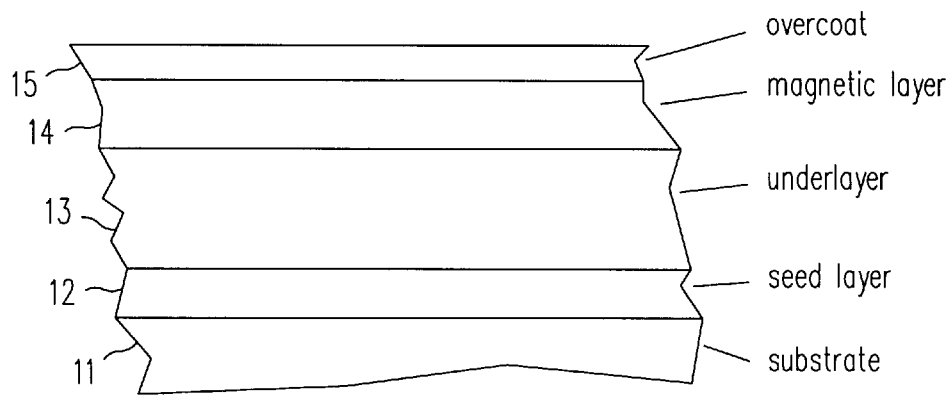
FIG. 2A is an expanded side view diagram of a disk coated in accordance with the present invention.

FIG. 2A is a cutaway view of a disk coated according to one embodiment of the invention. FIG. 2A shows a rigid substrate 11 which is typically metal or glass. When Al—Mg substrates are used a layer of nickel-phosphorus (not shown) lies on top of the base substrate. Glass substrates are typically coated with a very thin seed layer 12. An underlayer 13, typically of chromium, lies on top of the NiP or the seed layer. On top of the underlayer is a magnetic layer 14 which is typically composed of a cobalt alloy such as CoPtCr. The hydrogenated carbon (C:H) thin-film 15 of the present invention is applied as the top layer. The top thin-film coating is referred to as an overcoat. FIG. 2A shows the single layer embodiment of the invention with a gradient of hydrogen concentration increasing in the direction from the magnetic layer to the surface. A lubricant may be applied to the surface of the overcoat.

Properties of the disk overcoat required for optimum performance include, 1) good adherence to the magnetic material in the disk, 2) high hardness for wear durability, 3) low water wetability for corrosion resistance, and 4) control of surface properties for lube retention. FIGS. 3 through 7 (discussed below) indicate that these properties are optimized for different levels of hydrogenation. Additionally, high levels of hydrogenation at the film surface are necessary for lubricant retention during slider/disk contact.

Figure 2B:
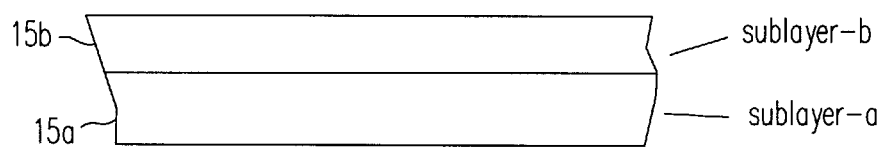
FIG. 2B is an expanded side view diagram of a two layer overcoat in accordance with the present invention.
Figure 2C:
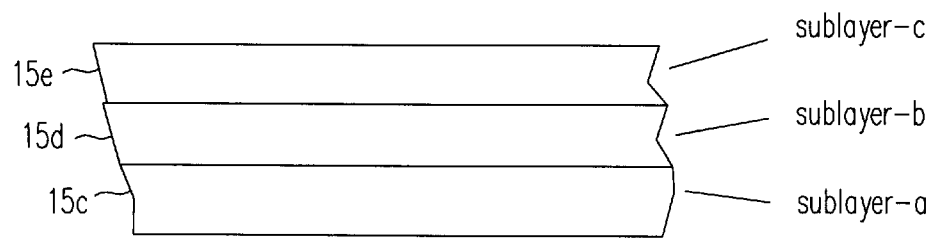
FIG. 2C is an expanded side view diagram of a three layer overcoat in accordance with the present invention.

To optimize the performance of the C:H thin-film overcoat, it has been discovered that varying levels of hydrogenation are needed in the thin-film. Two thin-film deposition processes which produce varying levels of hydrogenation have been developed. FIGS. 2B and 2C show two and three layer overcoat embodiments respectively. The lowest layer in each embodiment 15a, 15c have the lowest hydrogenation level. It this layer which will typically be in contact with the magnetic layer although additional layers over the magnetic layer are sometimes used. In the three layer embodiment an intermediate hydrogenation level is used in the middle layer 15d. In each of the two and three layer versions a high hydrogenation level is used in the top or surface layer of the thin-film 15b, 15e. In one embodiment the overcoat 15 comprises three sublayers or zones each with a different hydrogen content. In these embodiments of the invention, the bottom layer typically has a hydrogenation level of 15% or less, by atomic percentage. In a two layer implementation the hydrogen level in the bottom layer might preferably be chosen anywhere in the range from 0 at. % to 20 at. %, but even 20 to 30 at. % in the lowest layer will work as shown in the single layer gradient embodiment. However, good adhesion is maximized by lower hydrogen content as will be seen. The typical thickness of the bottom layer is in the range of 5 to 50 Angstroms. The middle layer in the three layer version typically has a hydrogenation level in the range of 20% to 35% by atomic percentage, and a thickness in the range of 10 to 150 Angstroms. The middle layer is preferably the thickest layer in order to benefit from its higher hardness which as will be seen can be greater than 12.5 GPa. The top layer is highly hydrogenated to a level of 35 at. % or greater. The practical upper limit of hydrogen percentage is believed to be around 40 at. %. The top layer is typically in the range of 5 to 50 Angstroms in thickness. The total thickness of the two or three layers should preferably be from 20 to 200 Angstroms.

One embodiment of the invention results in a single layer overcoat 15 having a gradient in the hydrogen concentration with the concentration increasing toward the film surface. In this embodiment the hydrogenation gradient will typically start at about 25% by atomic percentage at the bottom surface of the film that contacts the magnetic material in the disk. While it might be ideal for the gradient overcoat to start with no hydrogen at the lowest level, this is difficult to achieve in practice. Films having approximately 8 at. % hydrogen are a practical limit. When planning to sputter a gradient in a production environment, an initial level of 20 to 30 at. % is practical. Even with 25 at. % at the lowest level good adhesion and hardness are achieved. The hydrogenation level in the overcoat then increases through the film to reach approximately 35 to 40 at. % at the outer surface of the film to achieve the desirable surface properties. The resulting thin-film in this embodiment of the invention should preferably be approximately 50 to 200 Angstroms thick.

With each of the embodiments of the invention it is possible to obtain films with a superior combination of durability and corrosion resistance.

Each of the embodiments of the invention is formed using sputtering techniques that result in varying levels of hydrogenation in the thin-film. RF, mid-frequency and/or DC sputtering can be used. The C:H films are preferably DC sputtered using graphite targets and argon gas mixed with hydrogen gas ($H_2$), e.g., 0% to 35 at. % $H_2$. The parameters affecting the hydrogen content of the deposited film will be varied to achieve the target levels. The variations include (1) using dopant gases other than $H_2$, such as $CH_4$ or other hydrocarbons, (2) varying the deposition rate, and (3) varying the sputter pressure. The techniques are somewhat different in the two major types of sputter machines commonly used in thin film disk manufacturing; namely, 1) the in-line pallet type machines and 2) the single disk, cluster type sputter machines. In the single disk machines the deposition processes that are active in the deposition chamber affect only the single disk which is in the chamber at the time of deposition. In a single disk system it is a straightforward matter to produce a two or three layer overcoat by using two or three sputtering stations with the parameters adjusted to result in a C:H layer having a hydrogen level within the acceptable range for that layer.

The gradient embodiment of the invention can be achieved by varying the parameters affecting the hydrogen content as the film is being deposited so that the amount of hydrogen is incorporated into the film at the beginning is low and then increases during the continued deposition. For single disk systems, gradients can be controlled by actively controlling the concentration of dopant gas, the flow of the working gas or the pumping speed of the sputter system during the course of the deposition. The latter two process variables control the pressure of deposition which has been found to increase the dopant concentration of hydrogen in the film at fixed partial pressure of the dopant in the sputter gas. Increasing the flow of gas used as the source of hydrogen during the deposition process will tend to result in increased hydrogen being incorporated in the film on the substrate. Increasing the pumping speed at the lower pressure end of the chamber will tend to increase the hydrogen concentration gradient. One or more of the parameters affecting the hydrogen content of the layer can be varied gradually during the deposition to result in an increase in the hydrogen content of the layer toward the surface. The parameter variations may be continuous or in sufficiently small increments. Actual values of pumping speeds and percentage of dopant gas in the chamber, etc. to result in the target percentages of hydrogen content will typically be determined for a particular sputtering setup by selecting calibration points for sets of parameters, determining the resulting hydrogen content and then adjusting the parameters up or down accordingly. This calibration process is well within the capability of one of ordinary skill level in the sputtering art.

In the in-line pallet type machines, pallets containing multiple disks continuously pass by the targets depositing the overcoat films in the overcoat deposition chamber. In this type machine for the creation of the single layer gradient overcoat it is necessary to develop a gradient in either the dopant partial pressure through the machine or a gradient in the total pressure. The latter can be achieved by asymmetric pumping in combination with conductance restrictions along the dimension in which the disks are traveling. A typical in-line sputtering system will have a plurality of gas inlets which can be controlled independently to create pressure gradients in the dopant gas sufficiently large to affect the percentage of hydrogen being incorporated in the film as the pallet containing the substrate moves through the pressure gradient. It is also possible in in-line systems to include pressure locks between sputtering zones and, thereby, have zones with differing pressures, gas compositions and flow rates. This type of arrangement behaves more like a single disk system and can also be used to sputter the two or three layer overcoat as well as the gradient overcoat.

A scratch adhesion test was performed for various embodiments of the tri-layer thin film embodiment of the present invention. The lower layer of the thin film used in these tests in contact with the magnetic material in the disk is approximately 50 Å thick. The middle layer of the tri-layer thin film is approximately 100 Å thick. The top layer of the tri-layer thin film is approximately 50 Å thick. Four different constructions of the tri-layer thin film were tested. Using an "H" to represent a hydrogenated layer with 38 at. % hydrogen and an "S" to represent layer with 22% hydrogen by atomic percentage in the carbon, the four test disks were HHH, SSH, SSS, HSS given as lower/middle/top respectively. The test demonstrates that for maximum scratch adhesion, the top layer of the tri-layer construction is key. The HHH and SSH versions performed virtually identically (150 GMS critical load) while the SSS results were less than 75 GMS and the HSS version was at about 25 GMS. Thus, when the top 50 Å layer of the tri-layer thin film is 38 at. % hydrogen the scratch adhesion is significantly improved over the scratch adhesion of a tri-layer construction with a top layer of 22% hydrogen by atomic percentage in the carbon. The 75 GMS for the SSS disk versus the HSS disk at 25 GMS value indicates that the hydrogenation in the lower layer further degrades adhesion.

FIG. 3 demonstrates that the adhesion on Cr/glass of a sputtered hydrogenated carbon film improves as the level of hydrogenation is reduced. To observe the delamination of films exposed to the atmosphere, an 1100 Å thick hydrogenated carbon film was applied on top of a chromium layer. The base substrate used was glass. Small amounts of delamination were observed from 10% to 35% hydrogen content with the delamination increasing dramatically above 35%. This confirms that hydrogen content decreases adhesion.

Figure 4:
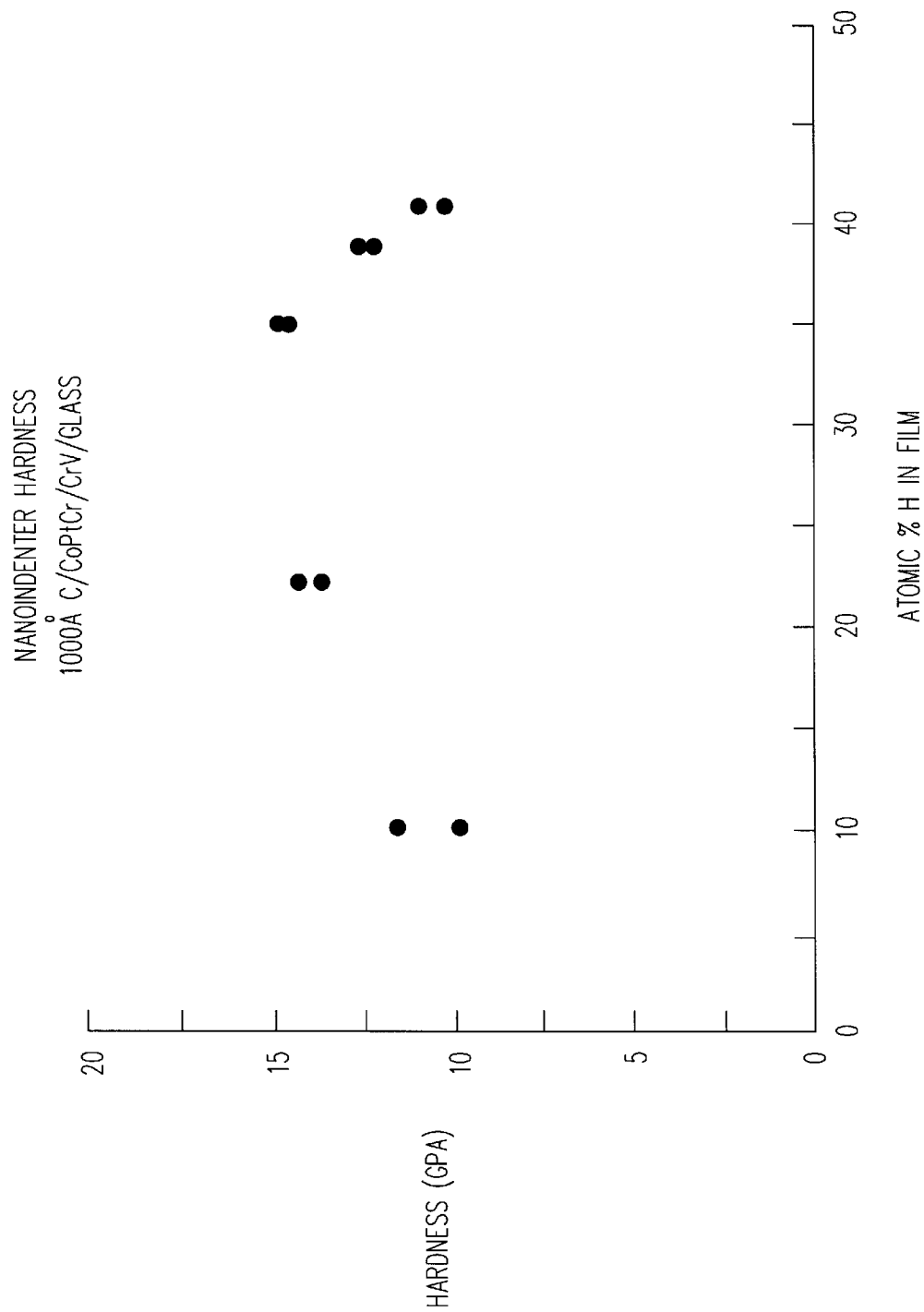
FIG. 4 is a graph of the hardness of a carbon-hydrogen film compared to the amount of hydrogenation of the film.

FIG. 4 demonstrates that the hardness of sputtered carbon film is maximized at intermediate levels of hydrogenation. The results shows that hardness is better for 20 to 35 at. % hydrogen than it is for 10 or 40 at. % hydrogen.

Figure 5:
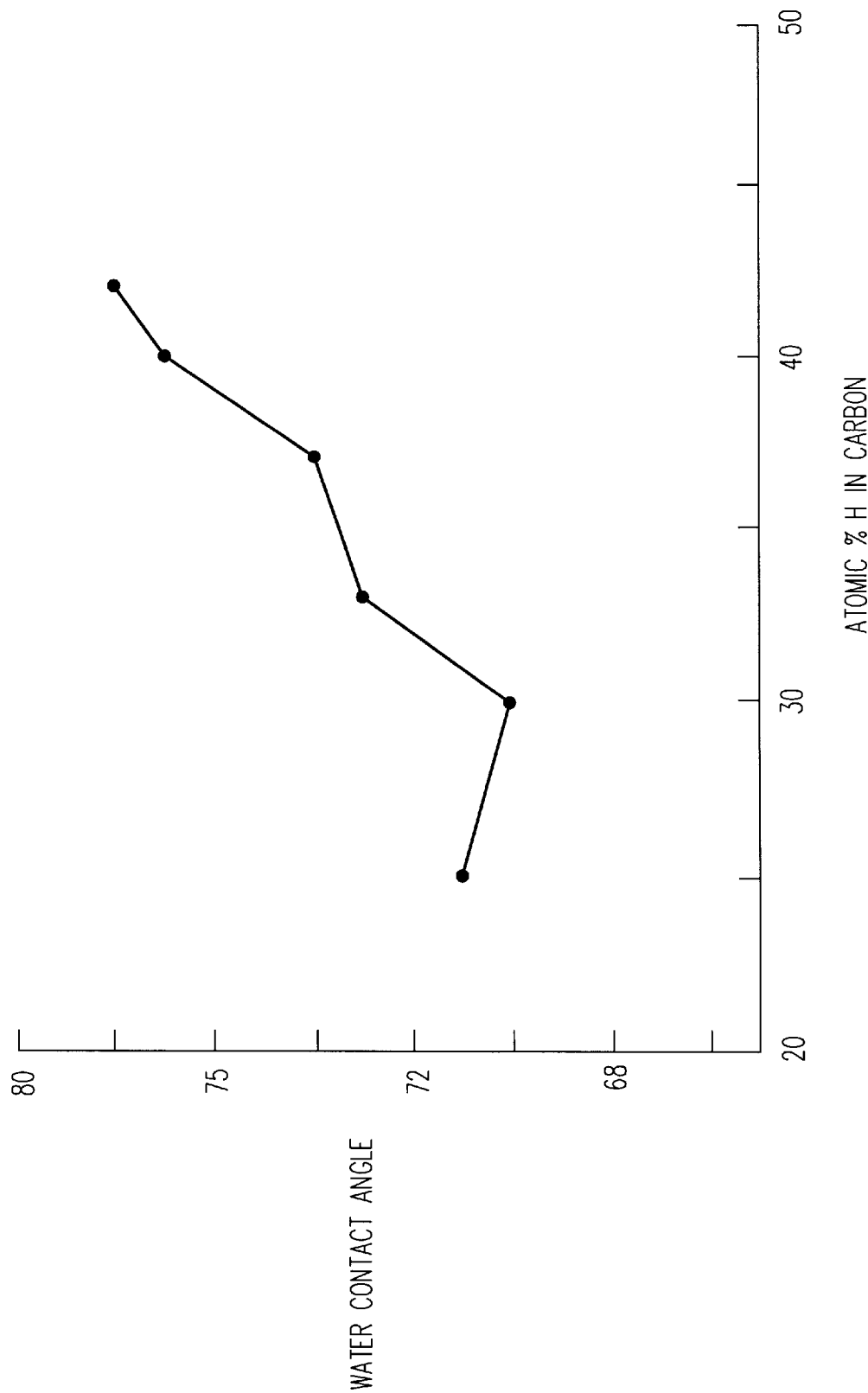
FIG. 5 is a graph of water contact angles versus hydrogenation levels.

FIG. 5 demonstrates that increased hydrogenation leads to C:H films which are more hydrophobic indicating lower surface energy. Hydrophobic materials are more corrosion resistant than hydrophilic materials. The vertical axis shows water contact angle which was measured as a proxy of the surface energy. Water contact angles greater than 72 degrees were achieved with hydrogen content greater than approximately 32 at. %. The water contact angle increases steadily from 30 at. % upward.

Data from flyability testing in corrosion enhancing environments of a single layer uniformly hydrogenated overcoat with about 30 at. % hydrogen and a hydrogen gradient overcoat of the invention ranging from about 25 to 30 at. % hydrogen at the lower zone to about 35 to 40 at. % at the surface showed that the corrosion products are clearly minimized on the overcoat which is sputtered with the hydrogen gradient.

Start/stop durability test data fit to Weibel regression statistics demonstrated that a significant improvement in durability is obtained for the films sputtered with a hydrogen gradient compared to a single layer uniformly hydrogenated film. The samples of the hydrogen gradient overcoat ranged from 25–30 at. % hydrogen at the lower zone to 35–40 at. % at the surface. The single layer uniformly hydrogenated overcoats had 30–35 at. % hydrogen.

FIGS. 6A–C plot dynamic SIMS data which profiles the hydrogen content through the thickness of the overcoat. The vertical axis is atomic hydrogen density (H/cm$^3$) divided by $10^{21}$. The horizontal axis is the depth in angstroms. The apparent drop in hydrogenation at the surface is an artifact of the measurement technique. Superior performance has been obtained for films with hydrogen gradients depicted in FIGS. 6B and 6C compared to the film with the nominally uniform hydrogenation shown in FIG. 6A. The samples of the hydrogen gradient overcoat as shown in FIG. 6B showed hydrogen content gradually declining from 30 to 40 at. % at the surface to a very minimal level, e.g. 3–5 at. %. The samples of the hydrogen gradient overcoat as shown in FIG. 6C showed a much slower decline in hydrogen content with even the lowest zone having appreciable hydrogen content, i.e., about 25 to 30 at. %. The single layer uniformly hydrogenated overcoat shown in FIG. 6A. had 30–35 at. % hydrogen.

The foregoing description has been given without regard to contamination elements that may enter into thin films even in clean environments. For example, even minute amounts of air can result in measurable hydrogen, oxygen or nitrogen being incorporated into the film. In addition, sputtering targets are not 100% pure and can be a source of a variety of contaminants. The films tested as described above would certainly contain contaminants, but in insufficient quantity to affect the performance as measured.

The present invention has been described in detail for a coating for disks. Other uses of the coating are possible and within the scope of the invention. A particularly likely use for the coating, in addition to a coating for disks, is as a coating on a slider or other head assembly used in a disk drive. The coating can applied over a substrate used for a slider. One skilled in the art would be able to produce the three embodiments of invention on sliders with the teachings herein.

What is claimed is:

1. An article of manufacture for use as a wear resistant component in a disk drive comprising:

a substrate having zero or more thin film layers thereon; and a thin film protective layer disposed on the substrate or thin film layer to form a surface, the thin film protective layer containing carbon and hydrogen with a lowest atomic percentage of hydrogen of less than 10 atomic percent occurring nearest the substrate or thin film layer and increasing gradually towards the surface with a highest atomic percentage of hydrogen occuring at the surface.

2. The article of manufacture of claim 1, wherein the highest atomic percentage of hydrogen is greater than 35%.

3. The article of manufacture of claim 1, wherein the surface layer has a water contact angle greater than 72 degrees.

4. The article of manufacture of claim 1, wherein the thin film protective layer has a thickness from approximately 50 to 200 Å.

5. An article of manufacture for use in a disk drive as a component subject to wear comprising:

a first thin film layer, deposited on a substrate or previous thin film layer, containing hydrogenated carbon (C:H), with X atomic percentage of hydrogen and X being less than or equal to 10%;

a second thin film layer, deposited on the first thin film layer, containing C:H, with Y atomic percentage of hydrogen and Y being greater than X; and a surface thin film layer, deposited on the second thin film layer, containing C:H, with Z atomic percentage of hydrogen and Z being greater than Y.

6. The article of manufacture of claim 5, wherein the hydrogen content Z of the surface layer is 35 at. % or greater.

7. The article of manufacture of claim 7, wherein the hydrogen content Y of the second layer is in the range of 20% to 35% by atomic percentage.

8. The article of manufacture of claim 5, wherein the hydrogen content Z of the surface layer is 35 at. % or greater, and the hydrogen content Y of the second layer is in the range of 20 to 35 at. %.

9. The article of manufacture of claim 5, wherein a total thickness of the first, second and surface thin film layers is from 20 to 200 Å.

10. The article of manufacture of claim 5, wherein second layer has a hardness greater than 12.5 GPa.

11. The article of manufacture of claim 5, wherein the surface layer has a water contact angle greater than 72 degrees.

12. An article of manufacture for use in a disk drive as a component subject to wear comprising:

a first thin film layer, deposited on a substrate or previous thin film layer, containing carbon and hydrogen (C:H), with an atomic percentage of hydrogen in the range from 0% to 10%; and a surface thin film layer, deposited on the first thin film layer, containing C:H, with an atomic percentage of hydrogen greater than 35%.

13. The article of manufacture of claim 12, wherein a total thickness of the first and surface thin film layers is from 20 to 200 Å.

14. The article of manufacture of claim 12, wherein the hydrogen content Y of the first layer is sufficient to result in a hardness of the first layer greater than 12.5 GPa.

15. The article of manufacture of claim 12, wherein the hydrogen content Z of the surface layer is sufficient to result in a water contact angle greater than 72 degrees.

* * * * *